INVENTOR
NORMAN A. CARGILL
TREVOR D. READER

BY B. F. Griffin Jr.
ATTORNEY

Jan. 1, 1963 N. A. CARGILL ETAL 3,071,154

ELECTRO-PNEUMATIC FLUID AMPLIFIER

Filed Oct. 25, 1960

2 Sheets-Sheet 2

INVENTOR
NORMAN A. CARGILL
TREVOR D. READER

BY B. F. Griffin Jr.

ATTORNEY

United States Patent Office 3,071,154 Patented Jan. 1, 1963

3,071,154

ELECTRO-PNEUMATIC FLUID AMPLIFIER

Norman Allen Cargill, Audubon, N.J., and Trevor Drake Reader, Wayne, Pa., assignors to Sperry Rand Corporation, New York, N.Y., a corporation of Delaware Filed Oct. 25, 1960, Ser. No. 64,861
14 Claims. (Cl. 137—608)

The present invention relates to fluid amplifiers. More particularly, the present invention relates to pneumatic amplifiers for producing pneumatic output signals in response to electrical control signals, said amplifiers requiring no intermediate transducer for converting the electrical control signals to fluid control signals.

Fluid amplifiers are a comparatively recent addition to the data processing and control system arts. The amplifiers are small, rugged, and inexpensive. They may be constructed of plastic, metal, or ceramic material, and basically comprise a plurality of fluid ducts formed within substantially solid bodies of material. For further information concerning the characteristics and mode of operation of fluid amplifiers, reference should be made to the publications entitled Science and Mechanics, June 1960, and System Design, April 1960.

As explained in the aforementioned publications, fluid amplifiers heretofore known have required one or more control signal inputs for applying fluid control signals to control the power stream. That is, fluid amplifiers of the prior art are responsive to fluid control signals for producing fluid output signals. In order to control fluid amplifiers with electrical signals, it has heretofore been necessary to apply the electrical signals to an electrically actuated fluid valve. The fluid output signal from the valve is then applied to a control signal input of the fluid amplifier.

Therefore, an object of the present invention is to provide a fluid amplifier which does not require fluid control signals.

An object of this invention is to provide electrical means for controlling a fluid amplifier without the need for an intermediate transducer.

An object of this invention is to provide a fluid amplifier having only one fluid input stream called the power stream.

A further object of this invention is to provide means responsive to small power electrical signals for producing larger power fluid signals.

Still another object of this invention is to provide multistable switches responsive to electrical signals for producing fluid output signals.

The aforementioned objects are accomplished in the present invention by providing means to ionize the pneumatic fluid comprising the power stream as it enters the amplifier. The ionized fluid then passes through an electrostatic field to cause deflection of the fluid to a desired output.

In a second embodiment, a magnetic rather than an electrostatic field is used to deflect the ionized fluid.

Other objects of the invention and its mode of operation will become apparent upon consideration of the following description and drawings in which.

Figures 1, 3:
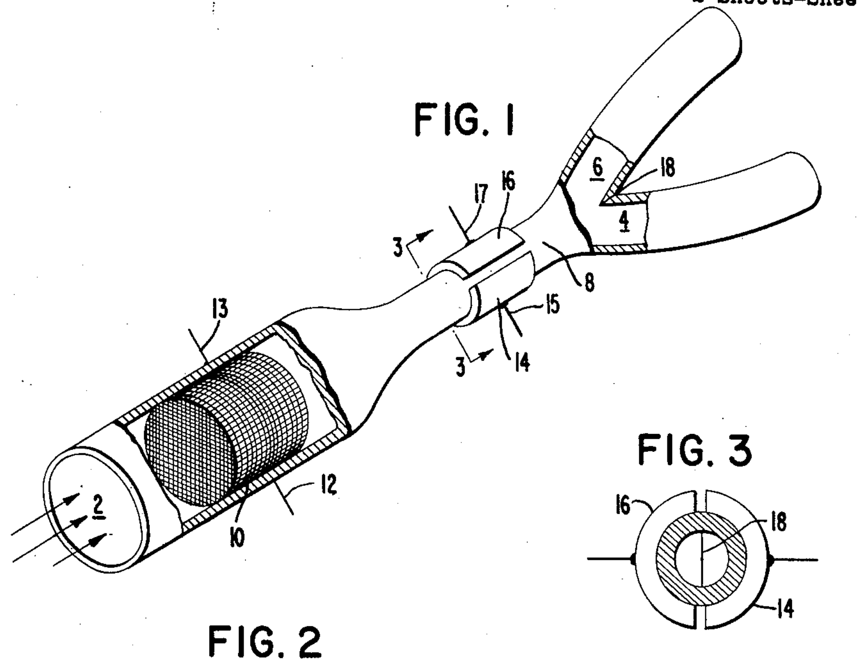
FIGURE 1 is an elevation view, partly in section, of an amplifier constructed in accordance with the present invention.
FIGURE 3 is a sectional view taken along the line 3—3 of FIGURE 1.

The fluid amplifier shown in FIGURE 1 comprises a substantially tubular body having an input duct 2 and right and left output ducts 4 and 6. A fluid source such as a compressor (not shown) continuously supplies a fluid such as air or gas to the input duct 2 from whence it passes through a constricted orifice or neck 8 to enter either output duct 4 or output duct 6.

Disposed within the input chamber is a grid-like structure 10 which is connected by leads 12 and 13 to a source of ionizing potential. The grid comprises a network of wires or filaments arranged in a manner to offer minimum resistance to fluid flow and at the same time provide a plurality of parallel channels through which the fluid may flow.

A pair of semicircular electrodes or plates 14 and 16 are concentrically arranged about the neck 8. The electrodes serve as the control signal inputs for the amplifier.

Figure 2:
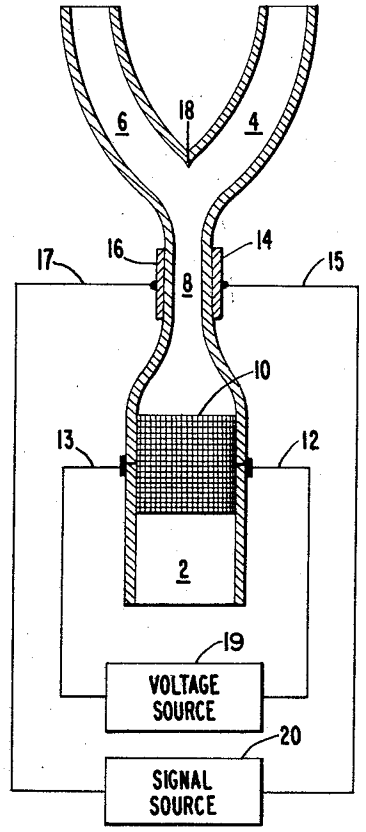
FIGURE 2 is a sectional view of a push-pull amplifier constructed in accordance with the present invention.

Referring now to FIGURE 2, the power stream of the amplifier enters duct 2 and flows through the grid 10. The grid is maintained at a high D.C. potential by voltage source 19. Thus, as the fluid particles pass through the grid, they are electrostatically charged as they contact the grid. For the purposes of explanation, it will be assumed that the particles of the fluid stream are positively charged although it will be obvious to those skilled in the art that the particles of the fluid stream might be negatively charged.

After passing through the grid, the charged particles of the fluid stream pass through the neck 8 and, in the absence of control signals on electrodes 14 and 16, emerge as a jet stream which strikes the divider 18 and divides into two substantially equal fluid streams which flow out through output ducts 4 and 6.

Assume now that signal source 20 applies a positive potential to electrode 16 and a negative potential to electrode 14. It is well known that like charges repel each other and unlike charges are attracted to each other. Thus, as the positively charged particles pass into the area between the electrodes, they are repelled by positive electrode 16 and attracted by negative electrode 14. This deflects the jet stream issuing from neck 8 so that a greater portion of the fluid flows into output duct 4 and a smaller amount flows into output duct 6. The result is a signal in the form of increased fluid pressure in duct 4 and a pressure signal of equal magnitude but opposite phase in duct 6. Upon removal of the potentials on plates 14 and 16, the jet stream will return to its initial path of flow and divide into substantially equal streams flowing into ducts 4 and 6.

On the other hand, if signal source 20 applies a positive potential to electrode 14 and a negative potential to electrode 16, a greater portion of the jet stream will be deflected into output duct 6 resulting in an increased pressure output signal from this duct and a corresponding decrease in pressure in duct 4. Again, the jet stream will return to its initial path of flow after the potentials are removed from plates 14 and 16.

Figure 4:
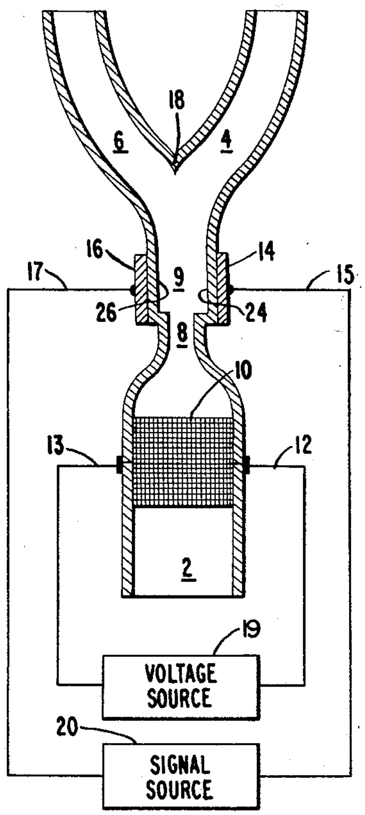
FIGURE 4 is a sectional view of a bistable amplifier having electrostatic deflection controls.

FIGURE 4 shows the basic concept of the present invention as applied to a bistable fluid amplifier. The input duct 2, output ducts 4 and 6, and grid 10 are the same as shown in FIGURE 2. However, the walls 24 and 26 are set back from the orifice where the jet stream issuing from neck 8 flows into ducts 4 and 6. Also, the divider 18 is asymmetrically located so that the opening into chamber 4 is larger than the opening into chamber 6.

Assuming that no control signals are applied to electrodes 14 and 16, the fluid applied to input duct 2 will pass through the restrictive orifice 8 and enter the chamber 9 as a high velocity jet. Because divider 18 is asymmetrically placed so that the opening into duct 4 is greater than the opening into duct 6, the jet will tend to flow into duct 4.

Note that the walls 24 and 26 are set back from orifice 8 so that chamber 9 is larger than the jet stream issuing from the orifice. Thus, the chamber 9 operates in much the same manner as an aspirator, with the high velocity jet sucking molecules of fluid from the regions between the jet stream and walls 24 and 26. Since the jet has an original tendency to flow into duct 4, the jet will suck more molecules of fluid from the region adjacent wall 24 than it will suck from the region adjacent wall 26. This results in a lower pressure adjacent wall 24 and the jet stream will be deflected so that it will flow adjacent wall 24 into duct 4.

If a negative potential is applied to electrode 16 and a positive potential applied to electrode 14, the fluid particles positively charged by grid 10 will be deflected toward the wall 26 as they pass into the electrostatic field created by the electrodes. As a result, the jet stream issuing from orifice 8 is deflected so that it flows into duct 6.

It is not necessary for the electrostatic field created by the electrodes to be strong enough to completely deflect the whole fluid stream against the wall 26. However, the electrostatic field must be strong enough to deflect a majority of the fluid particles to the left of divider 18. If a majority of the fluid particles are flowing into duct 6, the jet stream will be more efficient in sucking molecules of fluid from the region adjacent wall 26 than it will be in sucking molecules from the region adjacent wall 24. The jet stream then moves into the low pressure region adjacent wall 26 and "locks on" to the wall.

The jet stream issuing from orifice 8 will continue to flow out duct 6 even after the electrostatic field is removed.

Subsequent application of a positive potential to electrode 16 and a negative potential to electrode 14 will deflect the jet stream to the right of divider 18. Then, in the manner described above, the jet stream will again lock on to wall 24 and flow out through duct 4.

Figure 5:
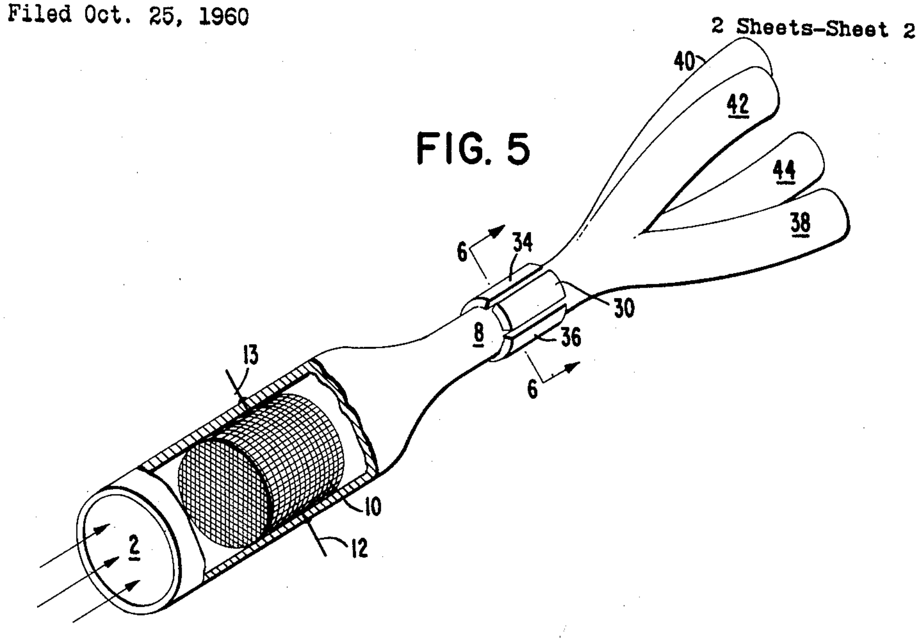
FIGURE 5 is an elevation view of a multistable amplifier according to the present invention.
Figure 6:
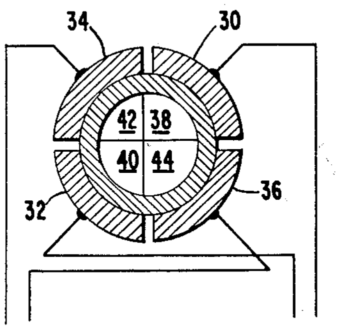
FIGURE 6 is a sectional view taken along the line 6—6 of FIGURE 5.

The present invention is admirably suited for multistable as well as bistable operation. The embodiment shown in FIGURES 5 and 6 is similar in many respects to the embodiment shown in FIGURES 1 and 4 but includes four electrodes for controlling the deflection of the power stream to one of four output ducts.

As with the embodiment of FIGURE 4, the electrodes 30 and 32 are energized simultaneously by applying potentials of opposite polarity. In like manner, electrodes 34 and 36 are energized simultaneously by applying potentials of opposite polarity. In a preferred mode of operation, potentials are never applied to more than one pair of electrodes at the same time.

Referring to FIGURE 6, and again assuming that grid 10 places a positive charge on the fluid particles, the fluid jet will be deflected into one of the output ducts 38, 40, 42, or 44 as indicated by the following chart.

| Potential applied to plates | | | | Fluid jet enters duct |
|---|---|---|---|---|
| 30 | 32 | 34 | 36 | |
| − | + | 0 | 0 | 38 |
| + | − | 0 | 0 | 40 |
| 0 | 0 | − | + | 42 |
| 0 | 0 | + | − | 44 |

Since the amplifier is stable in any one of four conditions, it will continue to flow through that duct to which it was last deflected, even after the deflecting potentials are removed from the electrodes. However, subsequent application of potentials of opposite polarity to the same electrodes or application of potentials to the other pair of electrodes, will cause the fluid stream to be deflected to another output duct.

The embodiments described above utilize the force exerted on charged particles by an electrostatic field for deflecting the power stream. The present invention also embraces the concept of using the force exerted on charged particles by a magnetic field for deflecting the power stream.

Figure 7:
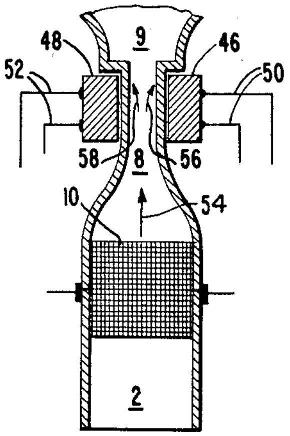
FIGURE 7 is a sectional view of a bistable amplifier having magnetic deflection controls.

As shown in FIGURE 7, the deflecting electrodes may be replaced by magnetic field generators 46 and 48. The magnetic field generators are responsive to signals applied over input leads 50 and 52 for selectively generating magnetic fields having a direction either into or out of the page as viewed in FIGURE 7. The particles charged by grid 10 move in the direction indicated by the arrow 59 and flow at right angles to the possible directions of the magnetic fields.

Assume for purposes of illustration that the grid 10 has placed a negative charge on the fluid particles and signals have been applied over leads 50 and 52 to cause the field generators to create a magnetic field directed into the page. It is well known that the force exerted on a negatively charged particle by a magnetic field is directed at right angles to both the direction of the particle and the direction of the magnetic field. Furthermore, the direction of this force is such that, if viewed in the direction of the magnetic field, the particle will move in a clockwise path. Therefore, under the conditions assumed, the fluid particles will tend to move as illustrated by directional arrow 56.

If the polarity of the signals applied to electromagnets 46 and 48 is reversed to create a magnetic field directed out of the page, the fluid particles will undergo a force which tends to move them in the direction indicated by arrow 58.

The magnetic deflection principal may be utilized in conjunction with a push-pull fluid amplifier as shown in FIGURE 2, a bistable amplifier as shown in FIGURE 4, or a multistable amplifier as shown in FIGURE 5. In any event, the velocity of the charged particles flowing through orifice 8 and the strength of the magnetic field generated by the magnets should be chosen such that the inertia of the charged particles will cause them to move into chamber 9 rather than entering a spiral trajectory within the orifice 8. With reference to the multistable amplifiers, consideration must be given to the velocity of the charged particles and the configuration of chamber 9. These however are matters of design consideration familiar to those skilled in the art.

While the novel features of the invention as applied to preferred embodiments have been shown and described, it will be obvious that various omissions and substitutions in the form and detail of the devices illustrated may be made without departing from the spirit and scope of the invention.

For example, in a multistable device such as that shown in FIGURE 5, it is possible to use an electrostatic field for controlling deflection of the power stream to one pair of output ducts and an electromagnetic field for controlling deflection of the power stream to the second pair of output ducts. Also, the present invention is not limited in its application to amplifiers having only two or four output ducts but may be used with amplifiers having three or more pairs of output ducts. It is intended therefore to be limited only by the scope of the appended claims.

We claim:

1. In a fluid amplifier of the type having a power stream input duct for receiving a fluid power stream and a plurality of output signal ducts, the improvement comprising: first electrical means for ionizing the fluid which flows through said power stream input duct; and second electrical means disposed about the path of said ionized power stream for selectively generating a field to thereby direct said power stream to one of said output signal ducts.

2. The improvement as claimed in claim 1 wherein said second electrical means comprises a plurality of pairs of electrodes, and means for selectively applying signals to said pairs of electrodes to create an electrostatic field through which said power stream must flow.

3. The improvement as claimed in claim 1 wherein said second electrical means comprises a plurality of means for generating magnetic fields through which said power stream must flow.

4. A device for converting electrical signals into fluid signals, said device comprising: a first fluid duct for defining a path of fluid flow; a fluid chamber connecting with said duct; a plurality of fluid ducts connected with said chamber whereby fluid may flow from said first fluid duct to said plurality of ducts through said fluid chamber; means for electrically charging fluid which flows through said first duct; means disposed about said fluid chamber for generating a field; and means for selectively energizing said field generating means to thereby deflect said electrically charged fluid into one of said plurality of fluid ducts.

5. A device as claimed in claim 4 wherein said means for charging said fluid comprises a charged grid within said first fluid duct, and said field generating means comprises a plurality of electrostatic deflection plates, one for each of said plurality of fluid ducts.

6. A device as claimed in claim 4, wherein said means for charging said fluid comprises a charged grid within said first fluid duct, and said field generating means comprises a plurality of magnetic field generators, one for each of said plurality of fluid ducts.

7. In a bistable fluid switch of the type wherein a pneumatic fluid stream applied to an input duct is selectively switched to one of two output ducts, the improvement comprising: means to ionize the particles of said pneumatic fluid; and means disposed about said input duct for selectively generating an electrostatic field, said field applying a force to said ionized particles to switch said fluid stream from a first of said output ducts to a second of said output ducts.

8. Control means for selectively switching a fluid amplifier, said control means comprising: grid means disposed within the power stream input duct of said amplifier for charging the fluid particles passing therethrough; and means, disposed adjacent the flow path of said fluid stream and downstream from said grid means, for deflecting said fluid particles in response to the charge thereon.

9. The combination comprising: a fluid amplifier having an input duct for receiving a fluid stream of pneumatic particles, a chamber connected to said input duct, and a pair of output ducts connected to said chamber, whereby said fluid stream may flow from said input duct and said chamber to a selected one of said output ducts; grid means within said input duct for charging said fluid particles on contact therewith; field generating means disposed adjacent the path of movement of said charged particles to apply a force thereto; and means for selectively applying electrical signals to said field generating means.

10. The combination as claimed in claim 9 wherein said field generating means comprises a pair of electrode plates for generating an electrostatic field; and said means for selectively applying electrical signals to said field generating means comprises means for applying a first potential to a first of said plates and a second potential to the second of said plates to thereby deflect said charged particles into one said output ducts.

11. A device as claimed in claim 10 wherein said fluid amplifier is bistable so that said charged particles continue to flow into said one output duct after said potentials are removed from said plates.

12. A device as claimed in claim 11, and further comprising means for applying said first potential to the second of said plates and said second potential to the first of said plates to thereby deflect said charged particles into the other of said output ducts.

13. Control means for controlling the flow of fluid particles in a device having a fluid input duct and a plurality of fluid output ducts, said control means comprising: means for charging the fluid particles in said input duct; and field generating means for selectively exerting force on said charged particles to thereby deflect them to a predetermined one of said output ducts.

14. The combination comprising: a fluid amplifier having an input duct for receiving a stream of particles, a chamber connected to said input duct, and a plurality of output ducts connected to said chamber, whereby said particles may flow from said input duct and said chamber to a selected one of said output ducts; charging means for charging said particles; field generating means disposed adjacent the path of movement of said charged particles for applying a force field to said charged particles; and means for selectively energizing said field generating means to thereby selectively direct said charged particles into said output ducts.

References Cited in the file of this patent

UNITED STATES PATENTS 2,875,780 Martin ---------------- Mar. 3, 1959